US010622739B1

(12) United States Patent
Regnier

(10) Patent No.: US 10,622,739 B1
(45) Date of Patent: *Apr. 14, 2020

(54) CONNECTOR SYSTEM WITH ADAPTER

(71) Applicant: Molex, LLC, Lisle, IL (US)

(72) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,213

(22) Filed: Jan. 21, 2019

Related U.S. Application Data

(63) Continuation of application No. 15/762,154, filed as application No. PCT/US2016/053716 on Sep. 26, 2016, now Pat. No. 10,186,794.

(60) Provisional application No. 62/232,660, filed on Sep. 25, 2015.

(51) Int. Cl.
*H01R 12/72* (2011.01)
*H01R 12/58* (2011.01)
*H01R 13/518* (2006.01)
*H05K 1/14* (2006.01)
*H01R 13/6583* (2011.01)

(52) U.S. Cl.
CPC ......... *H01R 12/722* (2013.01); *H01R 12/585* (2013.01); *H01R 13/518* (2013.01); *H01R 13/6583* (2013.01); *H05K 1/144* (2013.01); *H05K 2201/041* (2013.01); *H05K 2201/10189* (2013.01)

(58) Field of Classification Search
CPC ............ H05K 1/144; H05K 2201/041; H01R 12/722; H01R 12/585; H01R 13/518; H01R 13/6583
See application file for complete search history.

(56) References Cited

U.S. PATENT DOCUMENTS

| 3,871,728 | A | 3/1975 | Goodman |
| 6,443,768 | B1 | 9/2002 | Dirkers et al. |
| 6,520,802 | B1 | 2/2003 | Mitra |
| 6,749,448 | B2 | 6/2004 | Bright et al. |

(Continued)

FOREIGN PATENT DOCUMENTS

| CN | 1871748 A | 11/2006 |
| CN | 102265708 A | 11/2011 |

(Continued)

OTHER PUBLICATIONS

International Search Report and Written Opinion received for PCT application No. PCT/US2016/053716, dated Jan. 10, 2017, 9 pages.

(Continued)

*Primary Examiner* — Briggitte R. Hammond
(74) *Attorney, Agent, or Firm* — Molex, LLC

(57) ABSTRACT

A connector system includes a main board and an interposer board. The main board and the interposer board are each configured to mate to a separate connector and are connected together by vias. The vias can provide an electrical path from the interposer board to the main circuit board so that a first connector mounted on the interposer board can be positioned directly in line with a second connector mounted on the main circuit board. The interposer helps make the routing out of signal traces from the two connector simpler while reducing the need for additional layers on the main board. Two connectors can be press-fit mounted to the main board and the interposer board in a belly-to-belly configuration.

10 Claims, 10 Drawing Sheets

(56) References Cited

U.S. PATENT DOCUMENTS

| | | |
|---|---|---|
| 7,463,495 B2 | 12/2008 | Tanaka et al. |
| 8,310,838 B2 | 11/2012 | Kellermann |
| 8,979,558 B2 | 3/2015 | Rubens |
| 10,186,794 B2 | 1/2019 | Regnier |
| 2002/0025720 A1 | 2/2002 | Bright et al. |
| 2005/0254257 A1 | 11/2005 | Long |
| 2008/0020609 A1 | 1/2008 | Robinette |
| 2008/0305692 A1 | 12/2008 | Little et al. |
| 2010/0178804 A1 | 7/2010 | Long |
| 2011/0053415 A1 | 3/2011 | Fonteneau et al. |
| 2012/0077354 A1 | 3/2012 | Huang |

FOREIGN PATENT DOCUMENTS

| | | |
|---|---|---|
| CN | 204045878 U | 12/2014 |
| JP | H04-99381 U | 8/1992 |
| JP | H06-20750 A | 1/1994 |
| JP | 2002-015798 A | 1/2002 |
| JP | 2008-517432 A | 5/2008 |
| JP | 2012-134078 A | 7/2012 |

OTHER PUBLICATIONS

International Preliminary Report on Patentability received for PCT Application No. PCT/US2016/053716, dated Apr. 5, 2018, 7 pages.
Notice of Allowance received for Japanese Application No. 2018-515436, dated May 21, 2019, 5 pages. (2 pages of English translation and 3 pages of official copy).

CONNECTOR SYSTEM WITH ADAPTER

RELATED APPLICATIONS

This application claims priority to U.S. application Ser. No. 15/762,154, filed Mar. 22, 2018, now U.S. Pat. No. 10,186,794, which is a national phase of PCT Application No. PCT/US2016/053716, filed Sep. 26, 2016, which in turn claims priority to U.S. Provisional Application No. 62/232,660, filed Sep. 25, 2015, all of which are incorporated herein by reference in their entirety.

TECHNICAL FIELD

This disclosure relates to field of input/output (IO) connectors, more specifically to IO connectors in stacked configurations.

DESCRIPTION OF RELATED ART

IO connectors are frequently used to in server and switch applications. One issue that exists with current switches and servers is the need for additional bandwidth per front face area. While stacked connectors help provide additional port density, for certain applications stacked connectors are insufficient. Attempting to stack three ports vertically is problematic from a manufacturing standpoint. One attempt to address this problem is to provide a belly to belly design, which involves mounting two connector to the same circuit board, with both connectors being mounted on opposing sides but in the location.

A belly-to-belly solution works fairly well with single ports that can be surface mount (SMT) attached but SMT attachment introduces process limitations and thus some individuals would prefer to press-fit their connectors into the circuit board. While it is possible to press-fit two connectors to opposing sides of a circuit board, providing belly to belly designs requires either a very thick motherboard (which often would be cost prohibitive) or unique footprints/routing configurations that are difficult to ensure support high data rates. Attempting to increase the data rate is also difficult, especially as data rates reach 25 Gbps per transmit/receive channel as circuit boards become increasing lossy as high frequencies. Consequentially, further improvements to allow for increased front panel density would be appreciated by certain individuals.

SUMMARY

A connector system is disclosed that includes a main board with a first connector mounted on a first side and a second connector positioned on a second side of the main board, the first and second connector aligned in a belly-to-belly arrangement. The first connector engages a first set of vias on the main board. The second connector is positioned on an interposer board that is arranged adjacent the main board. The interposer board includes a second set of vias that engage tails of the second connector. The second set of vias are coupled via traces to a third set of vias. A set of double tails are positioned in the third set of vias. The double tails provide an electrical connection between the third set of vias and a fourth set of vias that are provided on the main board. The first and fourth sets of vias are aligned so that the fourth set of vias is behind the first set of vias. The interposer board can include a cutout that allows for a controller or a conditioner or suitable chips to be positioned there. As can be appreciated, the depicted embodiment allows for increased port density and the reuse of existing tooling.

BRIEF DESCRIPTION OF THE DRAWINGS

The present invention is illustrated by way of example and not limited in the accompanying figures in which like reference numerals indicate similar elements and in which.

DETAILED DESCRIPTION

Figure 1:
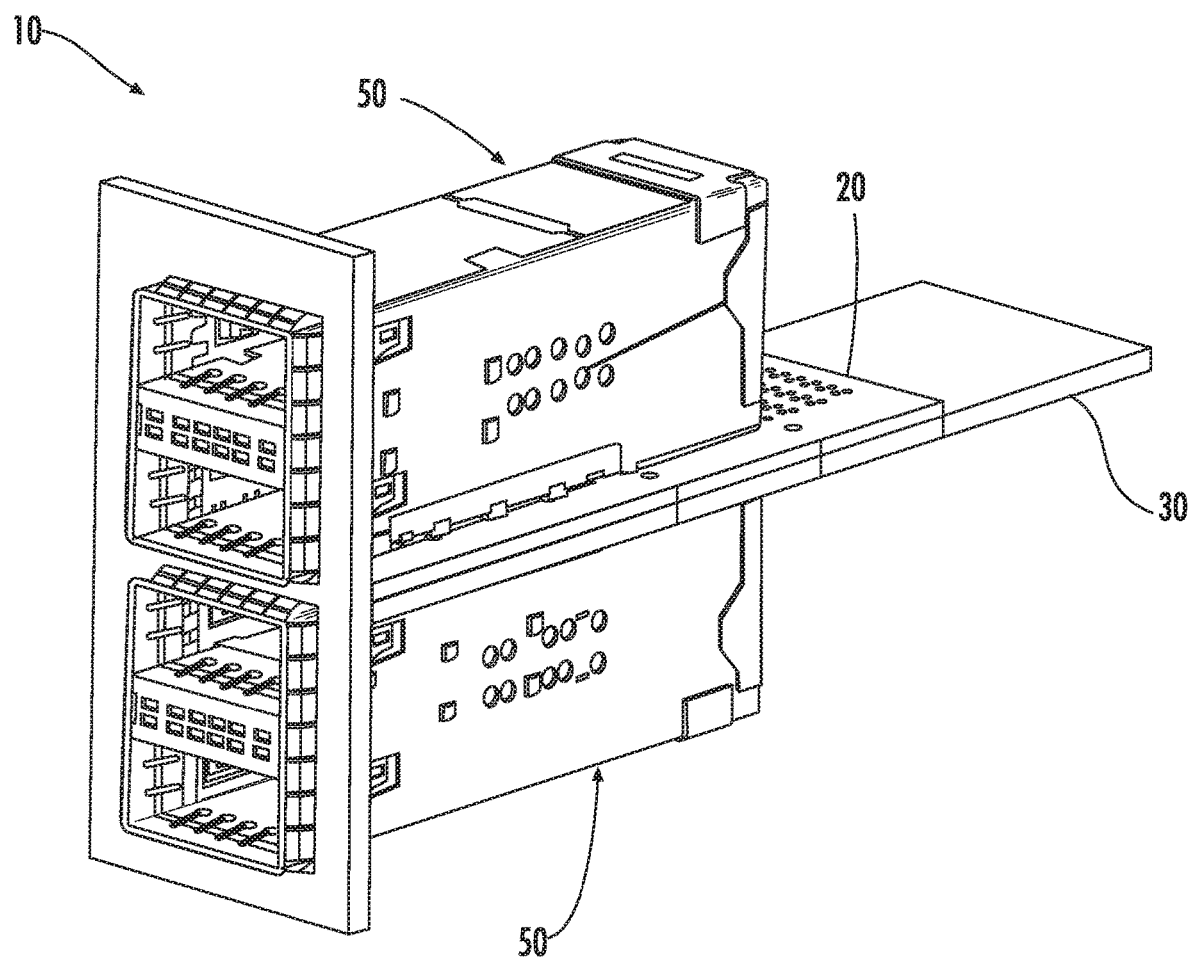
FIG. 1 illustrates a perspective view of an embodiment of a connector system.
Figure 2:
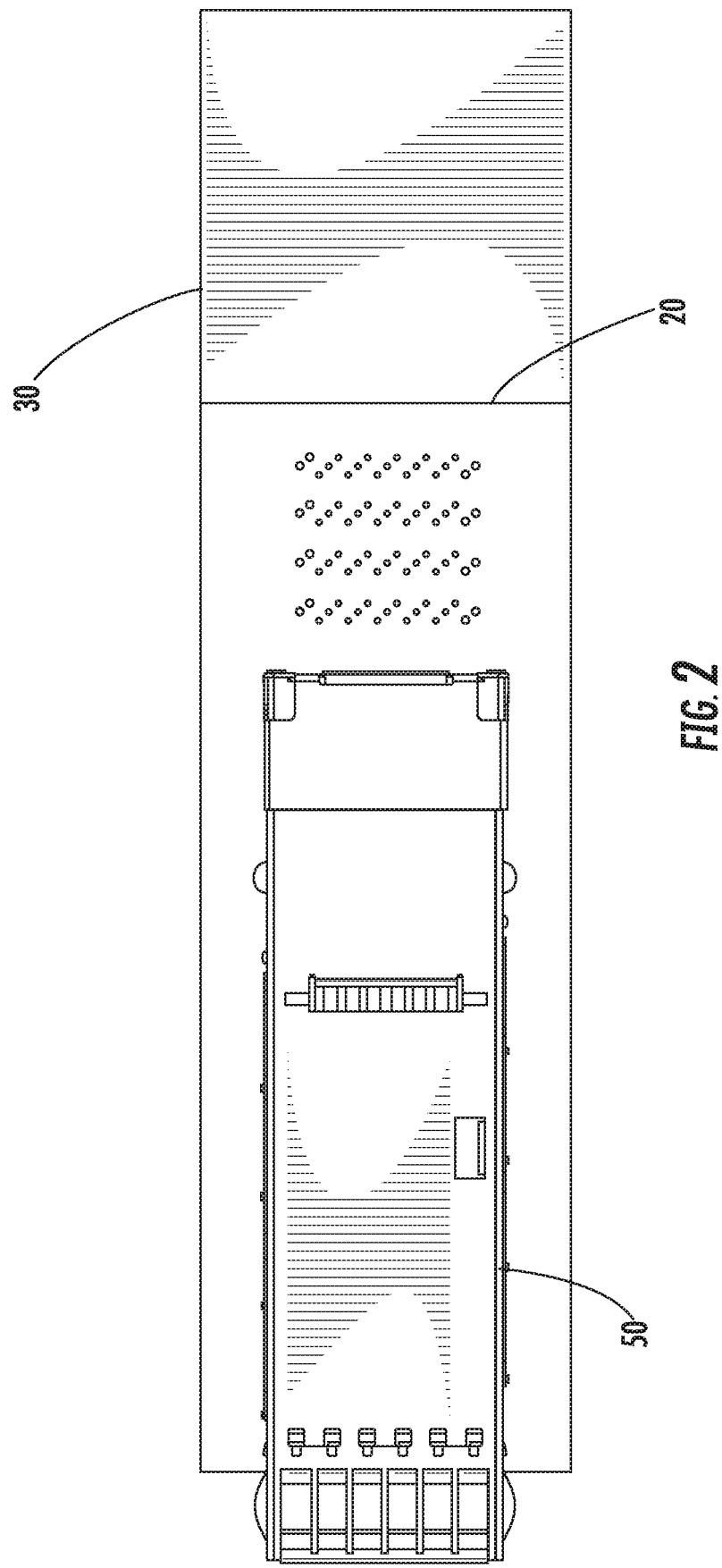
FIG. 2 illustrates a simplified top view of the embodiment depicted in FIG. 1.
Figure 3:
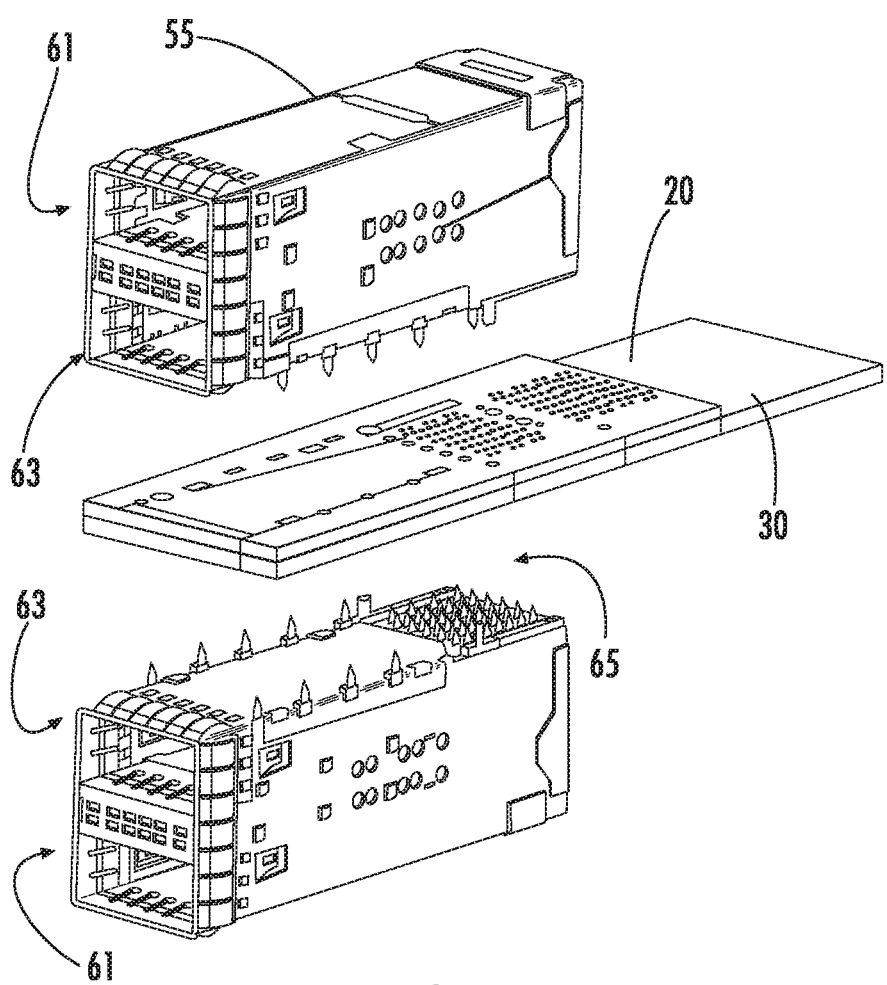
FIG. 3 illustrates a partially exploded perspective view of the embodiment depicted in FIG. 1.
Figure 4:
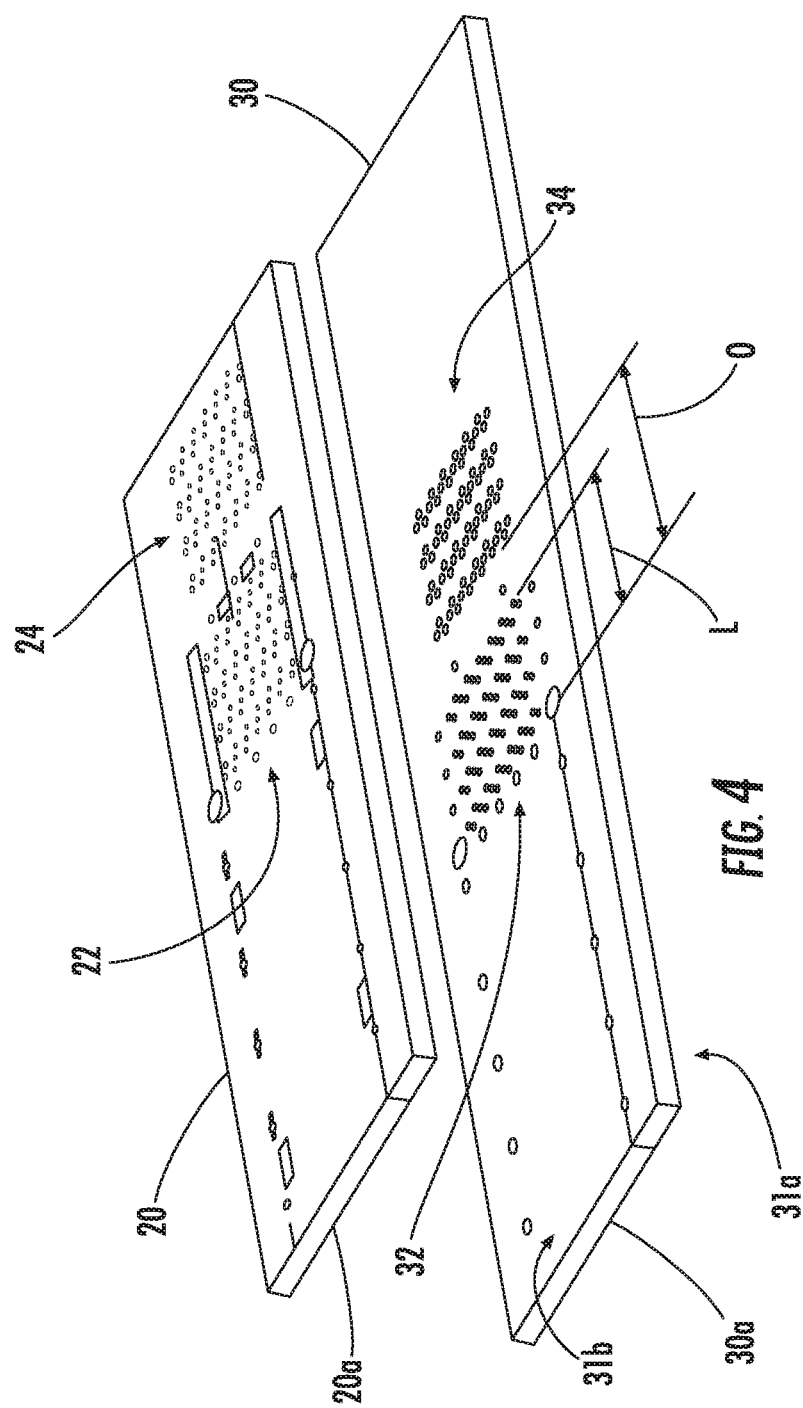
FIG. 4 illustrates an exploded perspective view of an embodiment of an interposer board and a main board.
Figure 5:
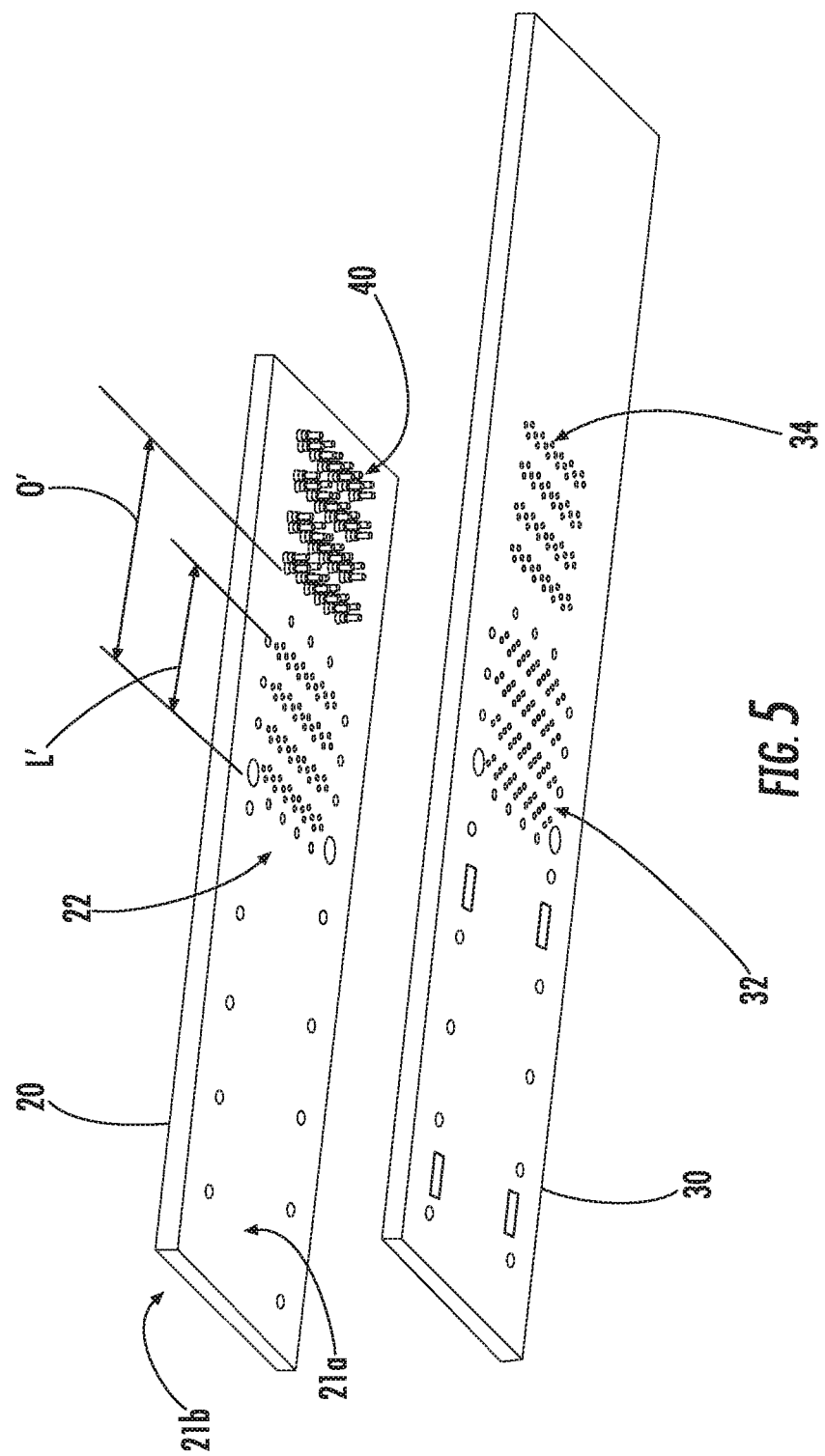
FIG. 5 illustrates another perspective view of the embodiment depicted in FIG. 4.
Figure 6:
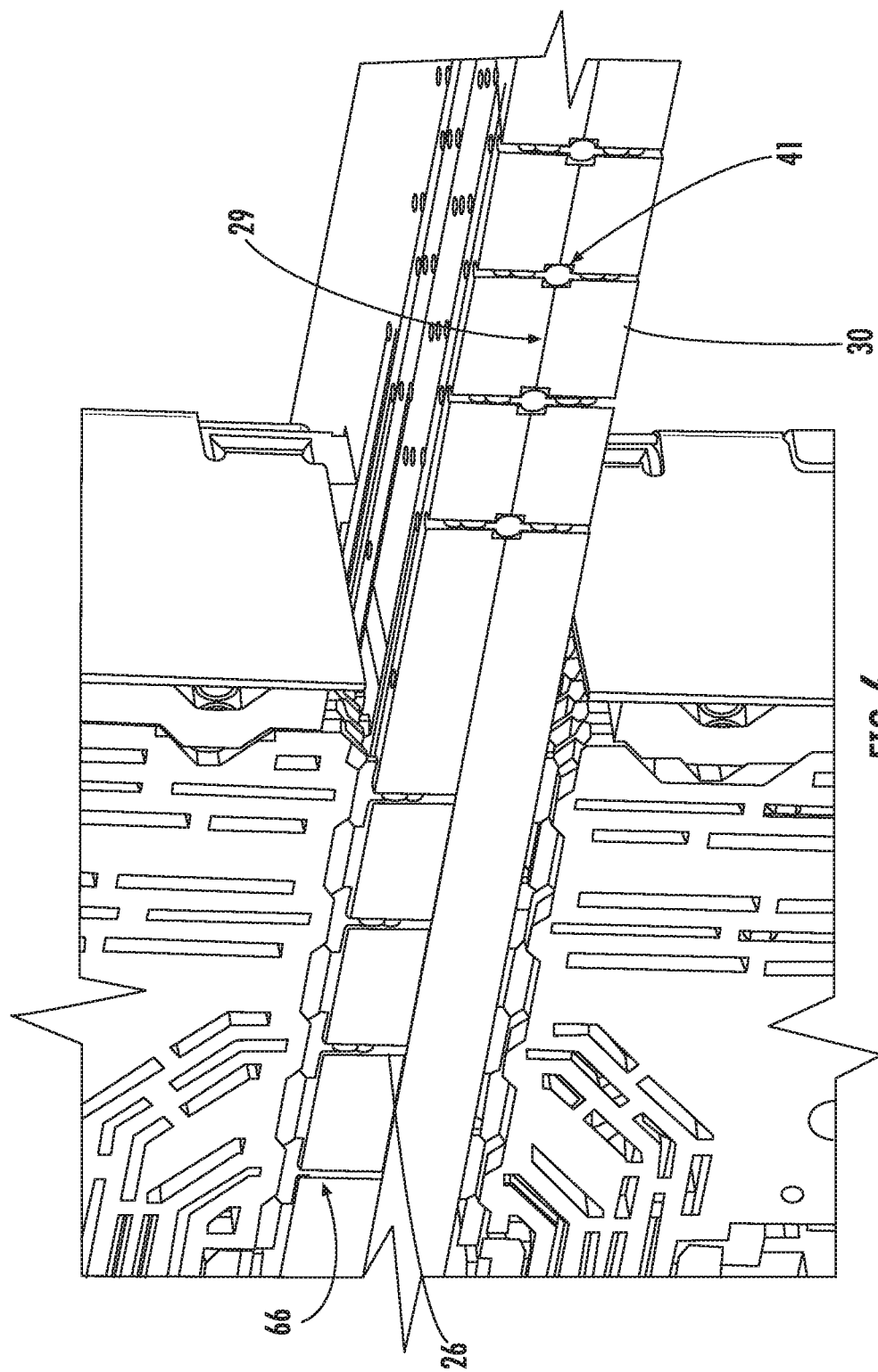
FIG. 6 illustrates a perspective cross-sectional view of an embodiment of a connector system depicting the connection between an interposer board and a main board.
Figure 7:
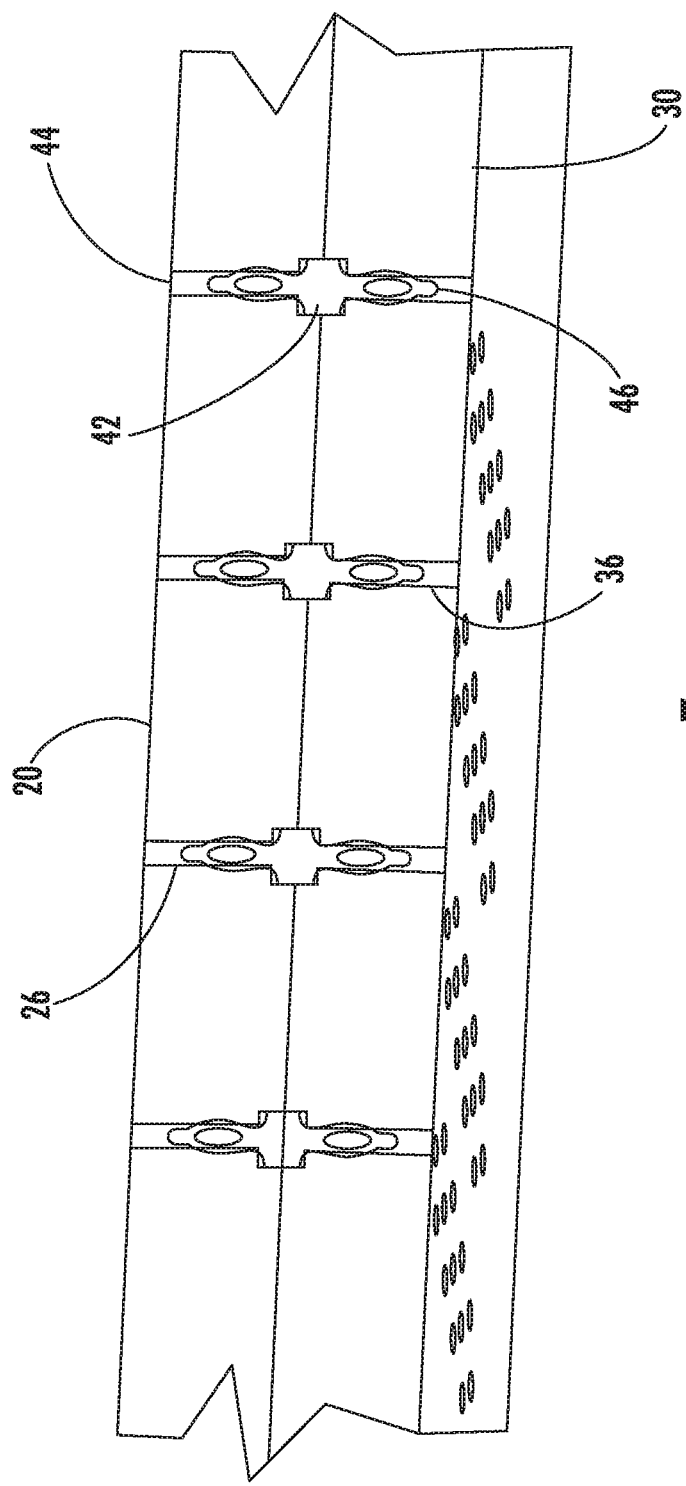
FIG. 7 illustrates a perspective cross-sectional view of an embodiment of a connection between an interposer board and a main board.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

As can be appreciated from the Figs., a connector system 10 includes a main board 30 with a first side 31a and a second side 31b and the main board 30 can be formed of conventional circuit board material or that can use other additive processes. The main board 30 supports a first stacked connector 50 and can further support a second stacked connector 50, where the first and second stacked connectors are in a belly-to-belly configuration. To provide room for the footprint, an interposer board 20 is mounted on the main board 30. Because the interposer board 20 provides vias to connect to the second connector 50, both the first and second connectors 50 can have the same footprint without the need for a thicker main board.

The main board 30 includes a first side 31a and a second side 31b and a front face 30a. A first set of vias 32 is on the first side 31a and the first set of vias 32 defines an area with a length L. The main board 30 further includes a second of vias 34 that are provided on the second side and the second set of vias are offset from the first set of vias an offset distance O that is greater than the thickness T. It should be noted that the embodiments provided depict an offset direction that is away from the front face 30a. In alternative embodiments the offset direction could be toward the front face 30a and it should be noted such a configuration could also be shared by the interposer board 20.

The interposer board 20 includes a front face 20a and a first side 21a and a second side 21b. A third set of vias 22 is positioned on the second side 21b and has an area with a length L'. A fourth set of vias 24 is provided on the first side 21a of the interposer board 20 and the fourth set of vias 24 are offset from the third set of vias 22 by an offset distance O'. In an embodiment the length L can be the same as the length L' and the offset distance O can be the same as the offset distance O'. Traces in the interposer board extend from the third set of vias 22 to the fourth set of vias 24 so as to act as a footprint offset or translation, thus the third set of vias 22 can be offset to a different location. In addition, the footprint of the fourth set of vias 26 can be different than the footprint of the third set of vias 22, thus the interposer board 20 can provide a mapping between two different footprints.

The depicted connectors 50 each include a cage 55 that defines a top port 61 and a bottom port 63. Each connector further includes an array of tails 65. The array of tails 65 can be configured to act as press-fit tails or some other tail configuration and in certain embodiments the connectors 50 can be press-fit into a corresponding board. While both connectors 50 are stacked connectors, other configurations are possible. For example, in some embodiments just one of the two connectors could be a stacked connector.

As can be appreciated, an array of tails 40 can be mounted the fourth set of vias 24 and the array of tails 40 can be used to connect the fourth set of vias 24 with the second set of vias 34. To allow for a connection, each tail 41 of the array off tails 40 can have a base 42 and a first press-fit finger 44 that is inserted into a via 26 and a second press-fit finger 46 can be inserted in a corresponding via 36 so that the tail 41 provides a connection between vias in the interposer board 20 and vias in the main board 30.

As can be appreciated, the interposer board 20 allows two connectors 50 to be press-fit mounted in the same area of the main board 30 without having to worry about the vias aligned with the tails of the first and second connectors 50 getting in the way or overlapping each. In addition, since there are only one set of tails positioned in each board, the route-out can be simplified.

Figure 8:
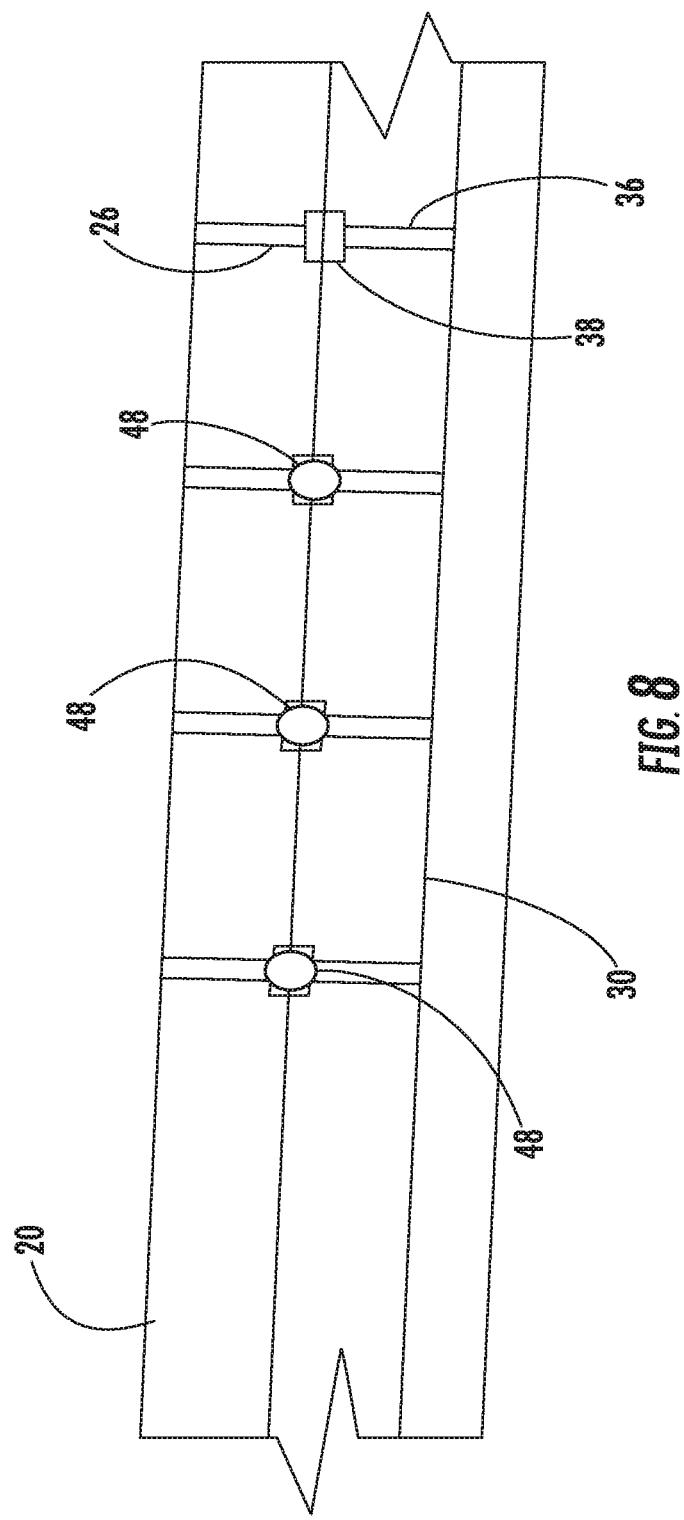
FIG. 8 illustrates a perspective cross-sectional view of another embodiment of a connection between an interposer board and a main board.

In should be noted that while tails 41 (which can be in the form of a double-tail) can be used to connector vias 26 to vias 36, another embodiment can use a solder charge 48 (which can be in the shape of a ball or take any other desired form) to make a solder connection between the interposer board 20 and the main board 30. The solder charges 48 can be position be positioned in wells 28, 38 positioned on either the vias 26, the vias 36 or both (as pictured in FIG. 8). The wells 28, 38 (which are optional) help hold the solder charge 48 in the correct position and help ensure a better connection between the vias 26, 36.

In operation, the first connector 50 can have tails that can be press-fit into a first set of vias. The second stacked connector 50 is positioned on the interposer board 20. The interposer board 20 acts to translate the array of tails 65 of the second stacked connector 50 an offset distance O' so that the main board 30 can provide a second set of vias that receives a set of tails 41 that can couple the interposer board 20 to the main board 30. In this way, a front panel can be provided that offers 4 ports in the height that basically doubles the height of a standard stacked connector. As can be appreciated, the ability to reuse the same stacked connector while provide substantially greater front panel density dramatically reduces tooling costs.

Figure 9:
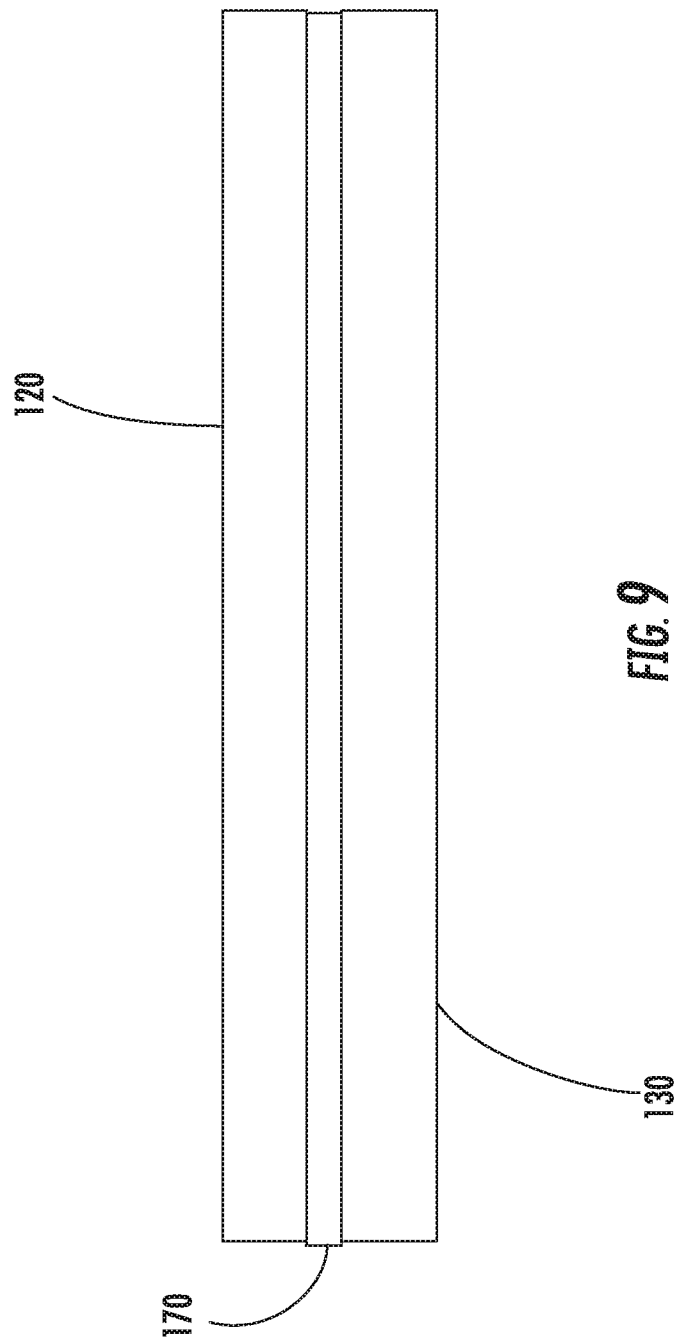
FIG. 9 illustrates a schematic representation of an interposer board and a main board connected together with a tail aligner positioned between the two boards.
Figure 10:
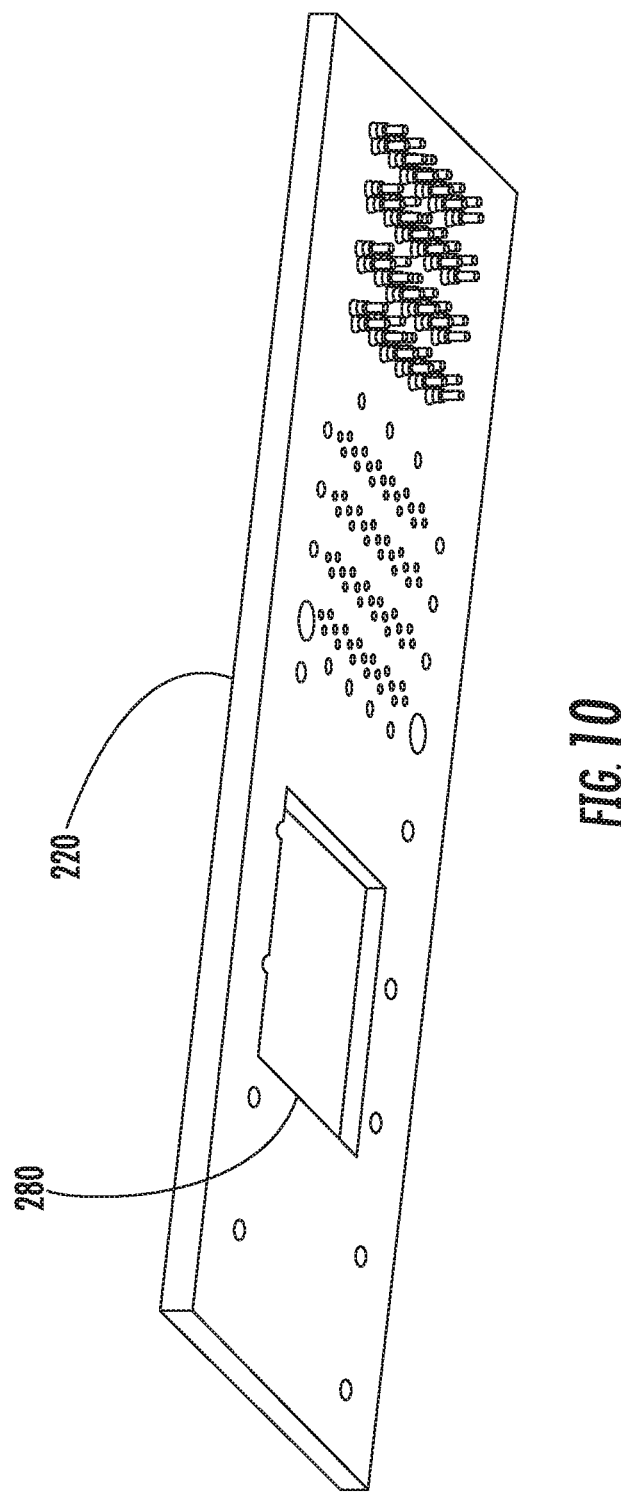
FIG. 10 illustrates a perspective view of an embodiment of an interposer board with a cutout.

As can be appreciated from FIG. 9, a main board 130 and interposer board 120 can further includes a tail aligner 170. The tail aligner 170, as is known, would help protect the tails 41 prior to installation and would be compressed between the main board 130 and the interposer board during installation of the interposer board 120 onto the main board 130.

It should be noted that the footprint pattern of the connector 50 may not be the same as the footprint of the array of tails 40. While connectors have certain limitations due to how they are formed, the layout of the array of tails 40 is less restrictive and the vias 26, 36, along with the array of tails 40, can be optimized for signal integrity or routing purposes.

It should be noted that an interposer board, such as interpose board 220 can include one or more cutouts 280 in areas outside of where the first and second of vias are located. The cutout 280 can provide space between the first and second connector and this space can be used to mount resistors and capacitors for filtering and conditioning of signals.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

I claim:

1. A connector system, comprising:
   a main board with a front face and a first side and a second side, the main board including a first set of vias on the first side and a second set of vias on the second side;
   a first stacked connector with a first set of tails positioned in the first set of vias;
   an interposer board provided on a second side of the main board, the interposer board having a third side and a fourth side, the third side including a third set of vias and the fourth side having tails that are inserted into the second set of vias, wherein traces connect the third set of vias to the tails; and
   a second stacked connector with a second set of tails mounted on the interposer board, the second set of tails positioned in the third set of vias.

2. The connector system of claim 1, wherein the first and second stacked connector have the same foot print.

3. The connector system of claim 1, wherein the first set of vias is closer to the front face than the second set of vias.

4. The connector system of claim 1, wherein the second set of vias is closer to the front face than the first set of vias.

5. The connector system of claim 1, wherein the tails on the fourth side are press-fit into the second set of vias.

6. The connector system of claim 1, wherein the first and second connectors are press-fit into the respective boards.

7. A connector system, comprising:
   a main board with a front face having a first set of vias on a first side and a second set of vias on a second side;
   a first stacked connector positioned on the first side with a first set of tails connected to the first set of vias;
   an interposer board provided on a second side of the main board, the interposer board having a third side and a fourth side, the third side including a third set of vias and the fourth side having a fourth set of vias that are aligned with the second set of vias, wherein the third and fourth sets of vias are connected by traces and the second and fourth sets of vias are connected via solder; and
   a second stacked connector with a second set of tails, the second set of tails connected to the third set of vias.

8. The connector system of claim 7, wherein the first set of vias is closer to the front face than the second set of vias.

9. The connector system of claim 7, wherein the interposer board has a plurality of wells aligned with a plurality of the vias in the fourth set.

10. The connector system of claim 7, wherein the main board has a plurality of wells aligned with a plurality of the vias in the second set.

\* \* \* \* \*